(12) United States Patent
Okubo

(10) Patent No.: US 9,893,038 B2
(45) Date of Patent: Feb. 13, 2018

(54) LIGHT-EMITTING DEVICE HAVING FIRST AND SECOND WIRING PATTERNS

(71) Applicant: Nichia Corporation, Anan-shi, Tokushima (JP)

(72) Inventor: Masaki Okubo, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/072,889

(22) Filed: Mar. 17, 2016

(65) Prior Publication Data

US 2016/0276553 A1 Sep. 22, 2016

(30) Foreign Application Priority Data

Mar. 18, 2015 (JP) .................. 2015-054369

(51) Int. Cl.
*H01L 25/075* (2006.01)
*H01L 33/36* (2010.01)
*H01L 33/38* (2010.01)
*H01L 33/46* (2010.01)
*H01L 33/50* (2010.01)
*H01L 33/52* (2010.01)
*H01L 33/62* (2010.01)

(52) U.S. Cl.
CPC .......... *H01L 25/0753* (2013.01); *H01L 33/36* (2013.01); *H01L 33/38* (2013.01); *H01L 33/52* (2013.01); *H01L 33/46* (2013.01); *H01L 33/504* (2013.01); *H01L 33/62* (2013.01); *H01L 2224/48137* (2013.01)

(58) Field of Classification Search
CPC ............... H01L 25/0753; H01L 33/504; H01L 33/36–33/38; H01L 33/62
See application file for complete search history.

(56) References Cited

U.S. PATENT DOCUMENTS

| 2011/0116252 A1* | 5/2011 | Agatani .................... F21K 9/00 362/84 |
| 2014/0055996 A1 | 2/2014 | Shimozawa |
| 2014/0175595 A1 | 6/2014 | Oka |

(Continued)

FOREIGN PATENT DOCUMENTS

| JP | 2013-062438 A | 4/2013 |
| JP | 2013-153081 A | 8/2013 |

(Continued)

*Primary Examiner* — Kevin Parendo
(74) *Attorney, Agent, or Firm* — Foley & Lardner LLP

(57) ABSTRACT

A light-emitting device includes a base; wiring patterns formed on the base; and light-emitting elements arranged on the base and/or the wiring patterns. The light-emitting elements include: a first group of light-emitting elements that are covered with a first sealing member and constitute a first light-emitting unit, and a second group of light-emitting elements that are covered with a second sealing member and constitute a second light-emitting unit. The wiring patterns include first wiring patterns that drive the first light-emitting unit, and second wiring patterns that drive the second light-emitting unit. The second wiring patterns are separated from each other such that at least one of the first wiring patterns is interposed between adjacent ones of the second wiring patterns. A wire connects said adjacent ones of the second wiring patterns.

8 Claims, 3 Drawing Sheets

(56) References Cited

U.S. PATENT DOCUMENTS

2014/0217428 A1* 8/2014 Chang ................ H01L 25/0753
                                                                257/89
2014/0340890 A1   11/2014 Hata et al.

FOREIGN PATENT DOCUMENTS

| JP | 2014-045089 A | 3/2014 |
| JP | 2014-082236 A | 5/2014 |
| JP | 2014-086694 A | 5/2014 |
| JP | 2014-143396 A | 8/2014 |
| WO | WO-2013/038854 A1 | 3/2013 |

* cited by examiner

LIGHT-EMITTING DEVICE HAVING FIRST AND SECOND WIRING PATTERNS

CROSS-REFERENCE TO RELATED APPLICATION

This application claims priority to Japanese Patent Application No. 2015-054369, filed on Mar. 18, 2015. The entire disclosure of Japanese Patent Application No. 2015-054369 is hereby incorporated by reference.

BACKGROUND

Technical Field

The present disclosure relates to a light-emitting device.

Discussion of the Background

Conventionally, there have been known light-emitting devices constituted such that white light is emitted by use of light-emitting elements that emit blue light and phosphorous materials that are excited by absorbing part of the blue light and emit light having longer wavelengths. As for the light-emitting devices above, there have been known light-emitting devices in which a plurality of light-emitting units are concentrically provided, and the light-emitting units can simultaneously emit light, as described, for example, in Japanese Unexamined Patent Application Publication No. 2014-82236 ("Patent Literature 1").

SUMMARY

A light-emitting device according to one embodiment includes a base, a wiring pattern formed on the base, and a plurality of light-emitting elements arranged on the base or the wiring pattern, and the plurality of light-emitting elements include a first light-emitting element group that is covered with a first sealing member and constitutes a first light-emitting unit, and a second light-emitting element group that is covered with a second sealing member formed in such a manner as to surround the first sealing member and that constitutes a second light-emitting unit, and the wiring pattern includes first wiring patterns that drive the first light-emitting element group, and second wiring patterns that drive the second light-emitting element group, and the second wiring patterns are separated from each other in such a manner that the first wiring pattern is interposed therebetween, and a wire connects the second wiring patterns separated from each other so as to straddle the first wiring pattern.

DESCRIPTION

Figure 1:
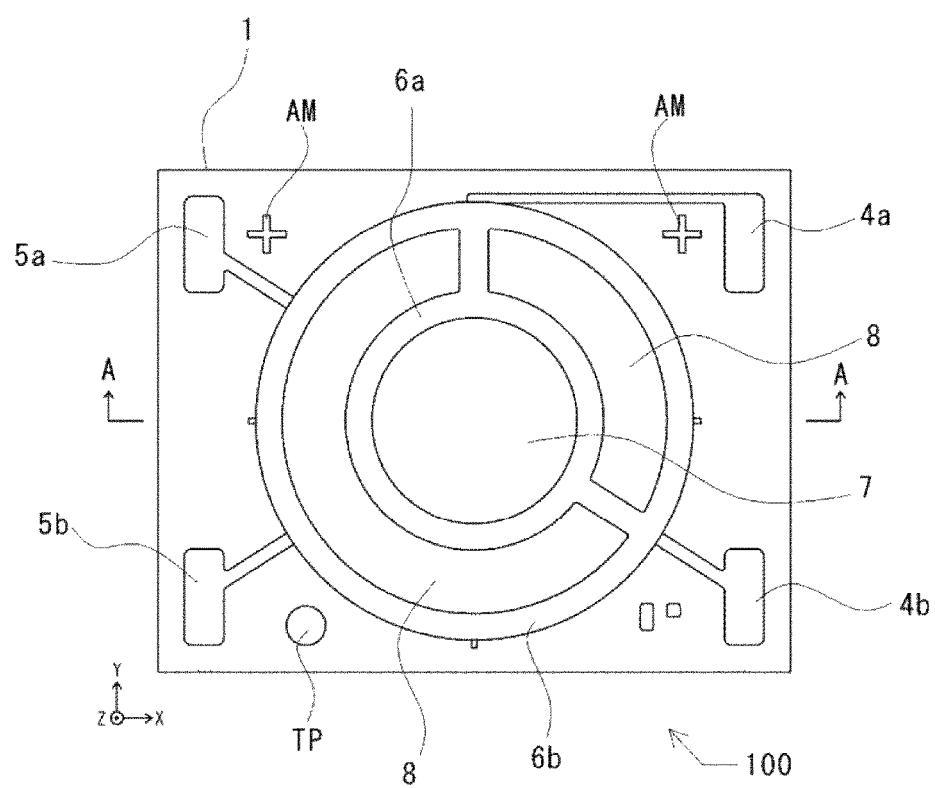
FIG. 1 is a schematic front view illustrating the entire constitution of a light-emitting device according to a first embodiment of the present invention.

Hereinafter, embodiments will be described referring to drawings. However, the embodiments described below are provided for the purpose of providing examples of the technical concept described in the present disclosure, and unless specifically stated otherwise, the present disclosure is not limited to embodiments described below. Also, disclosure related to one embodiment can be applied to other embodiments.

The magnitude and/or positional relationship of members illustrated in each drawing may be exaggerated so as to clarify the description. In the drawings, "X" direction is also referred to as "lateral" direction, "Y" direction as "longitudinal" direction, and "Z" direction as "up-and-down" direction or "height (thickness)" direction.

First Embodiment

A light-emitting device 100 according to a first embodiment will be described referring to FIGS. 1 to 3. It is noted that, for convenience, light reflective resins 6a and 6b in FIG. 2 are illustrated as being see-through, and the external shapes thereof are represented by a line. Sealing members (a first sealing member 7 and a second sealing member 8) are also illustrated as being see-through.

Figure 2:
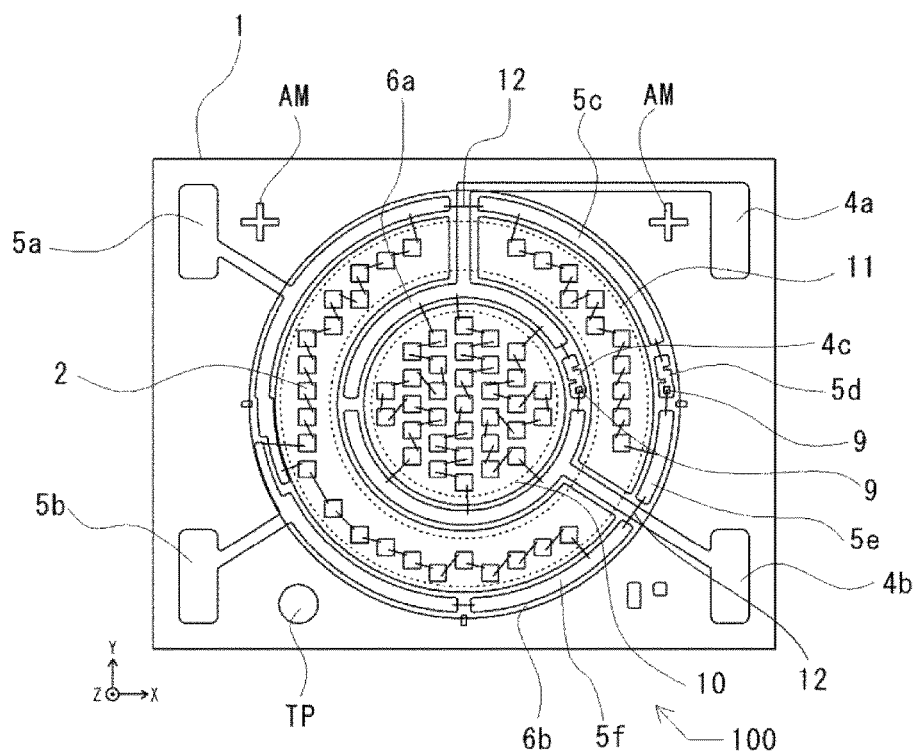
FIG. 2 is a schematic front view illustrating the constitution of the light-emitting device according to the first embodiment of the present invention.
Figure 3:
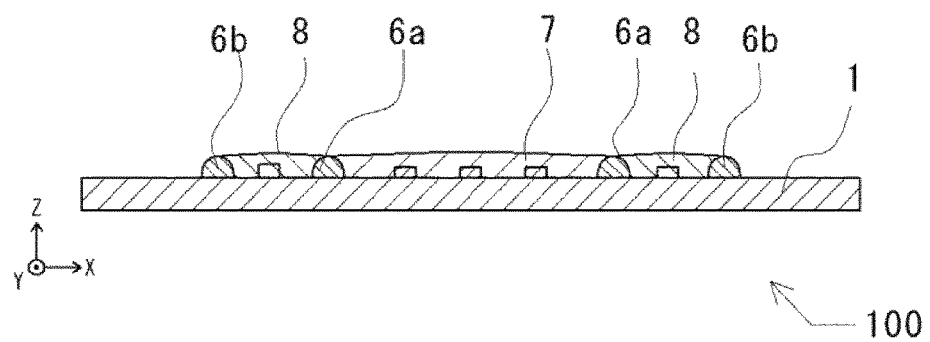
FIG. 3 is a schematic cross-sectional view taken along a line A-A in FIG. 1.

As illustrated in FIGS. 1 and 2, the light-emitting device 100 according to the present embodiment includes a base 1, wiring patterns formed on the base 1, and a plurality of light-emitting elements 2 (herein, the number of light-emitting elements is 66) arranged on the base 1. The light-emitting elements 2 include a first light-emitting element group 10 (the light-emitting elements encircled in a dotted line in FIG. 2, and the number of light-emitting elements is 33) that is covered with the first sealing member 7 and that constitutes a first light-emitting unit, and a second light-emitting element group 11 (the light-emitting elements encircled in a dotted line in FIG. 2, and the number of light-emitting elements is 33) that is covered with the second sealing member 8 formed in such a manner as to surround the first sealing member 7 and that constitutes a second light-emitting unit.

The wiring patterns are concentrically formed as illustrated in FIG. 2 and include first wiring patterns 4a to 4c that are formed along the first light-emitting element group 10 and drive the first light-emitting element group 10, and second wiring patterns 5a to 5f that are formed along the second light-emitting element group 11 and drive the second light-emitting element group 11. The first wiring patterns 4a to 4c and the second wiring patterns 5a to 5f each include an arc-shaped portion, and an inner-side circle is formed by the first wiring patterns 4a to 4c, and an outer-side circle is formed by the second wiring patterns 5a to 5f. Also, the second wiring patterns 5a and 5c are separated from each other and arranged between which the first wiring pattern 4a is interposed, and a wire 12 connects the second wiring patterns 5a and 5c so as to straddle the first wiring pattern 4a. Furthermore, the wire 12 connects the second wiring patterns 5e and 5f so as to straddle the first wiring pattern 4b.

Patent Literature 1 does not explicitly disclose wiring patterns in the case where each light-emitting unit emits light. For example, in the case where colors are mixed by adjusting the amount of light emission of each light-emitting unit, two-system independent circuits are required. Accordingly, in the case of what is called a single-sided board on which wiring patterns are provided only on the surface of a base, it is difficult to form the wiring patterns. Although a multilayer board can be used, the multilayer board necessitates an increase in cost, and therefore further reduction in cost is desired.

An object of the present disclosure is to provide a light-emitting device that can independently drive a plurality of light-emitting units even in the case of using a single-sided board.

The first wiring pattern 4a passes between the second wiring patterns 5a and 5c in such a manner as to be drawn out from the inner side to the outer side in a plan view and extends to the end portion of the base 1. The first wiring pattern 4a includes a pad portion (electric supply portion) at an end portion far away from the light-emitting elements of the first light-emitting element group 10, and the first wiring pattern 4b also includes the pad portion (electric supply portion) in a similar manner. The wire 12 connects the end portions of the second wiring patterns 5a and 5c in such a manner as to extend in the direction approximately orthogonal to the direction that the second wiring pattern 5a is drawn out. In other words, the wire 12 extends along the shape of a frame body formed by the light reflective resin 6b. Also, the length of the wire 12 is not particularly limited as long as the wire 12 is long enough to straddle the first wiring pattern 4a and connect the second wiring pattern 5a with the second wiring pattern 5c.

Thirty three light-emitting elements of the first light-emitting element group 10, are connected in series for each group of eleven light-emitting elements, and the three lines respectively made of the light-emitting elements connected in series are connected in parallel (three lines respectively made of eleven light-emitting elements connected in series are connected in parallel). Specifically, the electrodes of the adjacent light-emitting elements 2 are connected in series with the wires 12, and further the light-emitting elements 2, of which the both ends (a starting point and an end point) are connected in series, are respectively electrically connected to the first wiring patterns 4a and 4b by the wires 12.

In the first light-emitting element group 10, the plurality of light-emitting elements 2 are circularly placed in the central area of the base 1, and the first wiring patterns 4a and 4b that include the arc-shaped portion formed in such a manner as to surround the first light-emitting element group 10 are arranged. The first wiring pattern 4c, on which a protective element 9 is mounted, is arranged between the first wiring patterns 4a and 4b, and the first wiring pattern 4c is electrically connected with the first wiring patterns 4a and 4b by the wires 12 so as to establish inverse-parallel connection between the protective element 9 and the first light-emitting element group 10.

The first light-emitting element group 10, as described above, is covered with the first sealing member 7, and the light reflective resin 6a is formed in such a manner as to cover the arc-shaped portions of the first wiring patterns 4a and 4b and the first wiring pattern 4c. The first light-emitting element group 10 is surrounded by the light reflective resin 6a, and the first sealing member 7 is filled in this surrounded area, and a portion covered with the first sealing member 7 constitutes the first light-emitting unit.

In the second light-emitting element group 11, the light-emitting elements 2 are circularly arranged along the circumference of the first sealing member 7. As is the same with the first light-emitting element group 10, in the second light-emitting element group 11, three lines made of eleven light-emitting elements connected in series are connected in parallel. Specifically, the electrodes of the adjacent light-emitting elements 2 are connected in series by the wires 12, and further the light-emitting elements 2, of which the both ends (a starting point and an end point) are connected in series, are respectively electrically connected to the second wiring patterns 5c and 5e, the second wiring patterns 5f and 5a, and the second wiring patterns 5b and 5a by the wires 12.

The second light-emitting element group 11 is arranged in such a manner as to surround the first sealing member 7. Also, the second light-emitting element group 11 is covered with the second sealing member 8 and constitutes the second light-emitting unit. Herein, the light reflective resin 6b is formed so as to cover the arc-shaped portions of the second wiring patterns 5a and 5b, and the second wiring patterns 5c, 5d, 5e, and 5f. The second light-emitting element group 11 is surrounded by the light reflective resin 6b, and the second sealing member 8 is filled in the area surrounded by the light reflective resins 6a and 6b.

In other words, as illustrated in FIG. 1, the first sealing member 7 and the second sealing member 8 are separated from each other by the light reflective resin 6a and constitute the first light-emitting unit and the second light-emitting unit. The first light-emitting unit and the second light-emitting unit are concentrically formed.

The first wiring patterns 4a and 4b and the second wiring patterns 5a and 5b act as external terminal electrodes, so that approximately rectangular pad portions (electric supply portions) are formed in the four corners of the base 1 in such a manner that the wiring patterns are widened in a plan view as illustrated in FIGS. 1 and 2. An anode mark AM that indicates an anode is formed on each of the first wiring pattern 4a and the second wiring pattern 5a, each of which functions as a positive electrode. Each of the first wiring pattern 4b and the second wiring pattern 5b serves as a cathode. With this structure, the light-emitting device 100 includes a two-system circuit for the first wiring patterns and the second wiring patterns and allows the light-emitting elements of the first light-emitting element group 10 and the second light-emitting element group 11 to separately light up. Accordingly, it is not necessary to form structure in which the wiring patters are laid on two or more layers. Even in the case where a single-sided board is used, the first light-emitting unit and the second light-emitting unit can independently light up.

In the case where the first light-emitting unit and the second light-emitting unit emit the light of the same color, light-emitting areas can be selected by lighting up any one of the light-emitting units or lighting up both light-emitting units. For example, in the case where the light having a small light-emitting diameter needs to be emitted, only the first light-emitting unit lights up, and in the case where the light having a large light-emitting diameter needs to be emitted, the first light-emitting unit and the second light-emitting unit simultaneously light up.

Also, the emission spectra or color temperatures of the first light-emitting unit and the second light-emitting unit may differ. In this case, the first light-emitting unit and the second light-emitting unit emit different light-emitting colors, and the light of the different light-emitting colors is mixed, thereby obtaining a desired color tone. For example, the first light-emitting unit and the second light-emitting unit each emit light of different colors such as a cold color and a warm color, so that the light-emitting device can emit the light of various color tones in range from warm white color to daylight color. The light emission colors of the first light-emitting element group 10 and the second light-emitting element group 11 may differ, or the types or compounding ratio of wavelength conversion members of the first sealing member 7 and the second sealing member 8 may differ, in order to allow the first light-emitting unit and the second light-emitting unit to have different light emission colors.

The areas of the first light-emitting unit and the second light-emitting unit in a plan view can be formed with a desired area ratio depending on use or color tone. In the examples illustrated in FIGS. 1 to 3, the areas of the first light-emitting unit and the second light-emitting unit are formed in approximately equal size. In the present embodiment, the case where the first light-emitting unit and the second light-emitting unit are concentrically arranged has been described, but in a plan view, the shapes of the first light-emitting unit and the second light-emitting unit are not limited to concentrically shaped units, as long as the first light-emitting unit is arranged on the inner side, and the second light-emitting unit is arranged on its outer side. For example, the external shapes of the first light-emitting unit and the second light-emitting unit in a plan view may be formed in any shape such as a circle, an oval, a square, and a hexagon. In particular, it is preferable that the first light-emitting unit and the second light-emitting unit be similar in shape in a concentric manner.

(Base)

The base 1 on which electronic components such as the light-emitting elements 2 and the protective element 9 are to be placed includes the wiring patterns on the surface thereof. The base 1, as illustrated in FIGS. 1 and 3, is formed in a rectangular flat shape. A flat shape is preferable in term of reduction in cost, but the base 1 may include recess at sections where the light-emitting elements are to be placed. The size of the base 1 is not particularly limited but can be appropriately selected depending on purpose and use in terms of the number of light-emitting elements 2 and the intervals of arrangement, light-emitting areas, or the like.

As the materials of the base 1, it is preferable to use materials that have insulation properties and less likely to penetrate through the light discharged from the light-emitting elements or the light from the outside. Also, it is preferable to use materials having intensity to some degree. Specifically, the materials include ceramics (Al2O3, AlN, and the like), or resin such as phenol resin, epoxy resin, polyimide resin, BT resin, and polyphthalamide (PPA). A reflection member may be provided on the mounting surface of the light-emitting elements so as to enhance light reflectivity. The reflection member, for example, is made of the mixture of particles having light reflective properties such as titanium oxide (TiO2) and a binder of organic or inorganic matter, which corresponds to what is called white resist, white ink, or ceramics ink. As the binder of the organic matter, it is particularly preferable to use silicone resin having good heat resistance and light resistance. Accordingly, the light is reflected on the surface of the base, so that the light-emitting device that has the high efficiency of light extraction can be achieved.

(Light-Emitting Element)

The light-emitting element 2 is a semiconductor element that emits light by applying a voltage. As illustrated in FIG. 2, the plurality of light-emitting elements 2 are arranged on the upper surface of the base 1, and the whole of the plurality of light-emitting elements 2 constitutes the light-emitting units of the light-emitting device 100. The light-emitting elements 2 are bonded to the base 1 or the wiring patterns by bonding members. As the bonding method, for example, a bonding method in which resin or solder paste is used can be applied. As illustrated in FIG. 2, the light-emitting elements 2 may be bonded in such a manner that a p-electrode and an n-electrode are positioned on the upper surface, or may be bonded in such a manner that the p-electrode and the n-electrode are positioned on the lower surface, with what is called a flip chip bonding.

The light-emitting elements 2, as illustrated in FIG. 2, are each formed in a rectangular shape. As the light-emitting element, specifically, it is preferable to use a light emitting diode, and the light emitting diode having an arbitrary wavelength can be selected according to use. For example, ZnSe, nitride semiconductors and GaP can be used for the light-emitting element that emits blue light (wavelengths between 430 nm and 490 nm) or green light (wavelengths between 490 nm and 570 nm). Also GaAlAs and AlInGaP can be used for the light-emitting element that emit red light (wavelengths between 620 nm and 750 nm).

Also, in the case where the wavelength conversion members are contained in the first sealing member 7 and the second sealing member 8, it is preferable to use the nitride semiconductors that can emit the light of a short wavelength that can efficiently excite the wavelength conversion members. However, the composition of an ingredient, the light emission color, and size of the light-emitting elements 2 are not limited to the description above, but can be appropriately selected depending on purposes. Also, the light-emitting elements 2 can be constituted of elements that output not only light in a visible light area but also ultraviolet rays or infrared rays.

The light-emitting elements constituting the first light-emitting element group 10 and the light-emitting elements constituting the second light-emitting element group 11 may be of a same type, or may be of a different type, for example, which has a different light emission color.

(Wiring Pattern)

The first wiring patterns 4a to 4c and the second wiring patterns 5a to 5f electrically connect electronic components, such as the plurality of light-emitting elements 2 or the protective element 9 on the base 1, with an external power supply not illustrated and apply a voltage from the external power supply to the electronic components. That is, the wiring patterns act as electrodes (i.e., terminals) or part of the electrodes, through which electricity from the outside is conducted.

The materials of metal members constituting the wiring patterns are not particularly limited. For example, the wiring patterns are formed of such that metal or an alloy layer, for which the main ingredient is made of W, Mo, Ti, Ni, Au, Cu, Ag, Pd, Rh, Pt, and Sn as the materials of the wiring patterns formed into ceramics, is arranged on the base. Specifically, the wiring patterns are formed by vapor deposition, sputtering, or printing method and further being plated thereon. In view of little degradation and the adhesion to the bonding member, it is preferable to use a metal, for which the main ingredient is made of Au, be used on the uppermost surface of the wiring patterns. The thickness of the wiring patterns is not particularly limited, and the number of wires to be connected, the number of light-emitting elements to be mounted, power to be supplied, or the like can be appropriately selected according to purpose and use.

When forming the wiring patterns, a positioning mark, a mark representing polarity, and patterns for measuring a temperature may be concurrently formed together. The anode mark AM and the patterns TP for measuring a temperature are exemplified in FIG. 1.

Herein, part of the wiring patterns, as illustrated in FIGS. 1 and 2, is covered with the light reflective resins 6a and 6b. Accordingly, even in the case of using Au that is prone to absorb light depending on the wavelengths, the light emitted from the light-emitting elements is reflected by the light reflective resins 6a and 6b without reaching the wiring patterns. Consequently, loss in light emission can be alleviated, and the efficiency of light extraction in the light-emitting device 100 can be improved.

(Wire)

The wires 12 are members that electrically connect between the wiring patterns and the electrodes of the light-emitting elements 2, between the electrodes of the light-emitting elements 2, and between the wiring patterns. As the wires 12, metallic lines made of Au, Cu, Ag, Pt, Al or an alloy of the aforementioned metal can be used. As the wires 12, in particular, it is preferable to use Au, which is not easily broken by the stress from the sealing members and has good heat resistance. Alternatively, at least the surface of the wires 12 may be constituted of Ag or an alloy of Ag so as to enhance the efficiency of light extraction. Also, the diameter of the wires 12 is preferably in a range from 18 to 30 µm.

(Light Reflective Resin)

As for the light reflective resins 6a and 6b, it is preferable to use, for example, a material, in which a light reflection member is contained in the resin having insulation properties. For example, thermosetting resin or thermoplastic resin can be used so as to ensure intensity to some degree. More specifically, the phenol resin, the epoxy resin, the BT resin, the PPA, and the silicone resin can be exemplified. In the case where a non-light-emitting device such as a protective element is mounted on the base, the non-light-emitting device is preferably embedded in the light reflective resin because the non-light-emitting device becomes a cause of light absorption. As illustrated in FIGS. 1 to 3, the light reflective resin is preferably formed of a frame body having a frame shape, in which the sealing member is to be filled. The frame body can be formed by a drawing method of discharging the resin using a dispenser, a resin printing method, a transfer molding, a compression molding, or the like.

In the case where the light reflectance ratio of the light reflective resin is higher than that of the wiring patterns, the light reflective resin is preferably formed in such a manner as to cover the whole of wiring patterns in the light-emitting areas as illustrated in FIG. 2.

The wire 12 that straddles the first wiring pattern 4a and connects the second wiring pattern 5a with the second wiring pattern 5c is preferably covered with the light reflective resin 6b, more preferably completely embedded in the light reflective resin 6b. Accordingly, not only the wires 12 can be protected from dust, water, external forces, or the like, but also the first wiring pattern 4a and the wire 12 can be prevented from contacting each other, which reduce a risk of short circuit. In the case where the wires 12 are embedded in the light reflective resin 6b, the highest portion of the wires 12 is lower than the height of the light reflective resin 6b in the height direction. Also, it may be constituted such that part of the wires 12 is exposed from the light reflective resin 6b, and for example, it may be such that the highest portion of the wires 12 is higher than the height of the light reflective resin 6b in the height direction. The wire 12 that connects the second wiring pattern 5e with the second wiring pattern 5f is also preferably covered with the light reflective resin 6b.

(Sealing Member)

The first sealing member 7 and the second sealing member 8 are preferably made of a material that has electrical insulation properties, allows the light emitted from the light-emitting elements to transmit, and has fluidity before solidification. The light transmissivity of the sealing member is preferably 70 percent or more. Examples of the light transmissive resin are silicone resin, silicone modified resin, epoxy resin, phenol resin, polycarbonate resin, acrylic resin, TPX resin, polynorbornene resin, or hybrid resin that includes one or more of the aforementioned resins are included. Among them, the silicone resin has good characteristic in light resistance and heat resistance and has little volume contraction after the solidification, which is preferable.

(Wavelength Conversion Member)

The first sealing member 7 and/or the second sealing member 8 may include the wavelength conversion member that is excited by at least part of the light emitted from the light-emitting elements and emits light having a wavelength different from that of the light emitted from the light-emitting elements. As the representative wavelength conversion member, a phosphor or a quantum dot is included.

For example, blue-color light-emitting elements are used as the first light-emitting element group 10 and the second light-emitting element group 11, and a yellow-color phosphor is contained in the first sealing member 7, and the yellow-color phosphor and a red-color phosphor are contained in the second sealing member 8, thereby allowing the first light-emitting unit to emit white light and the second light-emitting unit to emit warm white light.

(Phosphor)

As for the phosphor used as the wavelength conversion member, phosphors of one type may be used, or phosphors of two or more types may be used. Any of known phosphors may be used as phosphors for LEDs. For example, phosphors of two types, which have a different particle diameter and light-emitting color, may be used. Thus, the phosphors of plural types that have a different light-emitting color are used, so that color reproduction and color rendering properties can be improved.

As yellow-to-green color phosphors, for example, yttrium aluminum garnet based phosphors (YAG based phosphors) and lutetium aluminum garnet based phosphors (LAG based phosphors) can be used. As green color phosphors, for example, chlorosilicate phosphors and β sialon phosphors can be used. As for red color phosphors, for example, SCASN based phosphors such as $(Sr, Ca)AlSiN_3:Eu$, CASN based phosphors such as $CaAlSiN_3:Eu$, and KSF based phosphors such as $SrAlSiN_3:Eu$ and $K_2SiF_6:Mn$ can be used, but not limited to these.

For example, for general lighting, it may be such that the blue-color light-emitting elements are used as the light-emitting elements 2, and the YAG based phosphor and the SCASN based phosphor are contained in the first sealing member, and the YAG based phosphor is contained in the second sealing member. Accordingly, the first light-emitting unit can emit the light having the color temperature of approximately 2700 K, the second light-emitting unit can emit the light having the color temperature of approximately 5000 K, and the light-emitting device can consequently emit the light having the color temperatures in a range from approximately 2700 to 5000 K by mixing the light of the first light-emitting unit and the second light-emitting unit.

In addition to the aforementioned wavelength conversion members, the sealing members may further include additives such as a filler and a diffusing agent. For example, $SiO_2$, $TiO_2$, and the like may be used as the dispersing agent.

Hereinbefore, the case where the two light-emitting units are provided has been described, but the number of light-emitting units may be further increased. For example, a third light-emitting unit may be provided on the outer side of the second light-emitting unit.

The light-emitting device according to the present disclosure can be utilized for various lighting apparatuses, light sources of the backlight of the liquid crystal display, large-size displays, various display devices for advertisements or destination guide, and further, image reading devices such as digital video cameras, facsimile machines, copying machines, and scanners, and projector devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light-emitting device comprising:
   a base;
   a plurality of wiring patterns formed on the base, the wiring patterns being formed using at least one method selected from the group consisting of vapor deposition, sputtering, printing, and plating;
   a plurality of light-emitting elements arranged on the base and/or the wiring patterns; and
   a plurality of wires;
   wherein the plurality of light-emitting elements include:
      a first group of light-emitting elements that are covered with a first sealing member and constitute a first light-emitting unit, and
      a second group of light-emitting elements that are covered with a second sealing member and constitute a second light-emitting unit, the second sealing member surrounding the first sealing member;
   wherein the plurality of wiring patterns include:
      a plurality of first wiring patterns that drive the light-emitting elements of the first light-emitting unit, and
      a plurality of second wiring patterns that drive the light-emitting elements of the second light-emitting unit;
   wherein the plurality of wires include:
      a plurality of first wires that connect the first wiring patterns to one another, and connect the light-emitting elements of the first light-emitting unit to one another, and
      a plurality of second wires that connect the second wiring patterns to one another, and connect the light-emitting elements of the second light-emitting unit to one another,
   wherein the second wiring patterns are separated from each other such that at least one of the first wiring patterns is interposed between adjacent ones of the second wiring patterns; and
   wherein at least one of the second wires connects said adjacent ones of the second wiring patterns and straddles said at least one first wiring pattern that is interposed between said adjacent ones of the second wiring patterns.

2. The light-emitting device according to claim 1, wherein emission spectra of the first light-emitting unit and the second light-emitting unit differ.

3. The light-emitting device according to claim 1, wherein the first sealing member and the second sealing member each contain a wavelength conversion member.

4. The light-emitting device according to claim 1, wherein color temperatures of the first light-emitting unit and the second light-emitting unit differ.

5. The light-emitting device according to claim 1, further comprising:
   a light reflective resin that separates the first sealing member from the second sealing member, wherein said at least one of the second wires is covered with the light reflective resin.

6. The light-emitting device according to claim 1, wherein the first light-emitting unit and the second light-emitting unit are concentrically formed.

7. The light-emitting device according to claim 1,
   wherein each of the first wiring patterns and the second wiring patterns includes an integral pad portion, and
   wherein, in a plan view, each of the pad portions is arranged at a respective corner of the base.

8. The light-emitting device according to claim 1, further comprising a third group of light-emitting elements that constitute a third light-emitting unit, the third light-emitting unit being located on an outer side of the second light-emitting unit.

* * * * *